United States Patent
Okawara (10) Patent No.: US 10,522,465 B2
(45) Date of Patent: Dec. 31, 2019

(54) SEMICONDUCTOR DEVICE

(71) Applicant: TOYOTA JIDOSHA KABUSHIKI KAISHA, Toyota-shi, Aichi-ken (JP)

(72) Inventor: Jun Okawara, Nisshin (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/149,800

(22) Filed: Oct. 2, 2018

(65) Prior Publication Data
US 2019/0103355 A1 Apr. 4, 2019

(30) Foreign Application Priority Data
Oct. 3, 2017 (JP) .................. 2017-193529

(51) Int. Cl.
*H01L 23/528* (2006.01)
*H01L 23/522* (2006.01)
(Continued)

(52) U.S. Cl.
CPC ...... *H01L 23/5283* (2013.01); *H01L 23/5226* (2013.01); *H01L 23/5329* (2013.01); *H01L 23/53223* (2013.01); *H01L 23/53266* (2013.01); *H01L 23/53271* (2013.01); *H01L 29/1095* (2013.01); *H01L 29/41708* (2013.01); *H01L 29/41741* (2013.01); *H01L 29/4238* (2013.01);
(Continued)

(58) Field of Classification Search
CPC ............. H01L 23/5283; H01L 23/5226; H01L 23/53223; H01L 23/53266; H01L 23/53271; H01L 23/5329; H01L 29/1095; H01L 29/41708; H01L 29/41741; H01L 29/4238
See application file for complete search history.

(56) References Cited

U.S. PATENT DOCUMENTS

2004/0021174 A1 2/2004 Kobayashi
2004/0238870 A1* 12/2004 Nakashima ......... H01L 23/5223
257/303
(Continued)

FOREIGN PATENT DOCUMENTS

JP 4004843 B2 11/2007
JP 2015233035 A 12/2015
(Continued)

*Primary Examiner* — Nathan W Ha
(74) *Attorney, Agent, or Firm* — Hunton Andrews Kurth LLP (57) ABSTRACT

A semiconductor device may include: a semiconductor substrate; an interlayer insulating film; a contact plug penetrating the interlayer insulating film; a first metal layer covering a surface of the interlayer insulating film; a protective insulating film covering a part of of the first metal layer; and a second metal layer covering the surface of the first metal layer. A peripheral region may be a region in which the protective insulating film is located; an active region may be a region in which a plurality of first parts of the contact plug is located; and an intermediate region may be a region which is located between the peripheral region and the active region and in which a second part of the contact plug is located. The first parts may extend toward an edge portion of the protective insulating film, and the second part may extend along the edge portion.

2 Claims, 6 Drawing Sheets

(51) Int. Cl.
  *H01L 29/417* (2006.01)
  *H01L 29/423* (2006.01)
  *H01L 23/532* (2006.01)
  *H01L 29/45* (2006.01)
  *H01L 29/10* (2006.01)
  *H01L 29/739* (2006.01)
  *H01L 29/78* (2006.01)

(52) U.S. Cl.
  CPC ........ *H01L 29/456* (2013.01); *H01L 29/7397* (2013.01); *H01L 29/7813* (2013.01)

(56) References Cited

U.S. PATENT DOCUMENTS

| | | | |
|---|---|---|---|
| 2013/0113111 A1* | 5/2013 | Lee | H01L 21/76883 257/774 |
| 2014/0084465 A1* | 3/2014 | Zhang | H01L 21/76816 257/741 |
| 2015/0228538 A1* | 8/2015 | Wada | H01L 21/76879 257/774 |
| 2015/0349091 A1* | 12/2015 | Yilmaz | H01L 29/66666 438/270 |
| 2015/0357289 A1 | 12/2015 | Fukami | |
| 2018/0047705 A1* | 2/2018 | Disney | H01L 25/0657 |
| 2018/0130699 A1* | 5/2018 | Zhang | H01L 21/76808 |
| 2019/0051600 A1* | 2/2019 | Oh | H01L 23/5283 |

FOREIGN PATENT DOCUMENTS

| | | |
|---|---|---|
| JP | 2017054928 A | 3/2017 |
| JP | 2018085421 A | 5/2018 |

\* cited by examiner

SEMICONDUCTOR DEVICE

CROSS-REFERENCE TO RELATED APPLICATION

This application claims priority to Japanese Patent Application No. 2017-193529 flied on Oct. 3, 2017, the contents of which are hereby incorporated by reference into the present application.

TECHNICAL FIELD

A technique disclosed herein relates to a semiconductor device.

BACKGROUND

A semiconductor device described in Japanese Patent Application Publication No. 2015-233035 includes a semiconductor substrate, a first metal layer, a protective insulating film, and a second metal layer. The first metal layer covers a surface of the semiconductor substrate. The protective insulating layer covers a part of a surface of the first metal layer. The second metal layer is constituted of a metal (Ni) different from a metal (AlSi) of the first metal layer. The second metal layer covers the surface of the first metal layer in a range not covered by the protective insulating film. Further, the second metal layer is in contact with an edge portion of the protective insulating film. Thus, the edge portion of the protective insulating film is a triple-contact portion where the first metal layer, the second metal layer, and the protective insulating film are in contact with each other.

Japanese Patent Application Publication No. 2017-054928 describes a semiconductor device including a contact plug. The contact plug is constituted of a metal and is provided to penetrate an interlayer insulating film. The contact plug is in contact with a semiconductor substrate. Surfaces of the interlayer insulating film and the contact plug are covered by a metal layer.

SUMMARY

In the semiconductor device of Japanese Patent Application Publication No. 2015-233035, high thermal stress is generated in the triple-contact portion when temperature of the semiconductor device changes. Repeated application of thermal stress to the triple-contact portion may result in a crack in the first metal layer with the triple-contact portion as its starting point. If the crack extends from the triple contact portion to an active region of the semiconductor substrate, characteristics of the semiconductor device may be deteriorated thereby.

Further, as aforementioned, Japanese Patent Application. Publication No. 2017-054928 describes the semiconductor device including the contact plug. In most cases, an active region of a semiconductor device is provided with a plurality of contact plugs extending in a stripe pattern. By providing the contact plug(s), thermal expansion of an electrode layer located on the contact plug(s) can be suppressed, and generation of a crack in the electrode layer can be suppressed.

Figure 9:
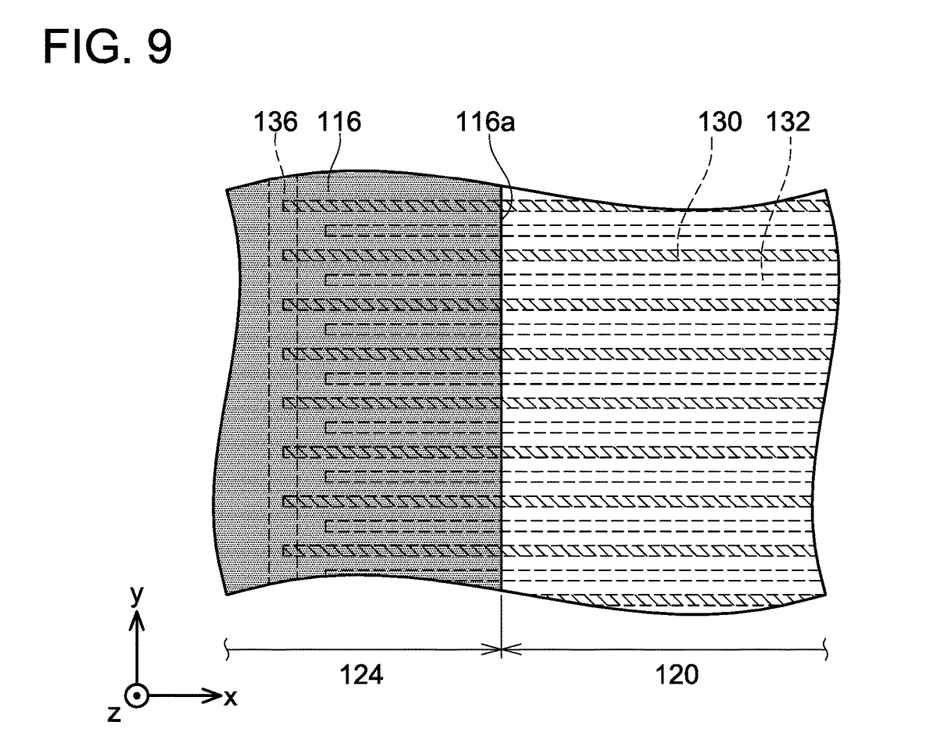
FIG. 9 is an enlarged view for a semiconductor device of a comparative example, corresponding to FIG. 2.

The configuration of Japanese Patent Application Publication No. 2015-233035 can be combined with the configuration of Japanese Patent Application Publication No. 2017-054928. That is, contact plugs extending in a stripe pattern can be provided in an active region, and a protective insulating film can be provided in a peripheral region which is located around the active region. An edge portion of the protective insulating film can include the configuration of the triple-contact portion, as in Japanese Patent Application Publication No. 2015-233035. In this case, as shown in FIG. 9, contact plugs 132 in an active region 120 extend toward an edge portion 116a of a protective insulating film 116 (i.e., extend along an x-direction) in parts of a border portion between the active region 120 and a peripheral region 124. The contact plugs extending along the x-direction can suppress thermal expansion of the first metal layer in a y-direction (in a direction along the edge portion 116a), whereas they are less effective in suppressing the thermal expansion of the first metal layer in the x-direction. Due to this, an effect that suppresses a crack extending from the edge portion 116a of the protective insulating film 116 (i.e., from the triple-contact portion) toward the active region 120 is low. Thus, there may be a risk that a crack intruding deeply into the active region 120 is generated. The disclosure herein provides a semiconductor device capable of suppressing generation of a crack extending from a triple-contact portion to an active region.

A semiconductor device disclosed herein may comprise: a semiconductor substrate; an interlayer insulating film located on the semiconductor substrate; a contact plug constituted of a metal, penetrating the interlayer insulating film, and being in contact with the semiconductor substrate; a first metal layer covering a surface of the interlayer insulating film and a surface of the contact plug; a protective insulating film covering a part of a surface of the first metal layer; and a second metal layer covering the surface of the first metal layer, being in contact with an edge portion of the protective insulating film, and constituted of a metal different from that of the first metal layer, wherein the semiconductor device may comprise a peripheral region, an active region, and an intermediate region in a view along a thickness direction of the semiconductor device, the peripheral region may be a region in which the protective insulating film is located; the active region may be a region in which a plurality of first parts of the contact plug is located; and the intermediate region may be a region which is located between the peripheral region and the active region and in which at least one second part of the contact plug is located, the first parts may extend toward the edge portion of the protective insulating film, and the at least one second part may extend along the edge portion of the protective insulating film.

In this semiconductor device, the at least one second part of the contact plug which extends along the edge portion of the protective insulating film is provided in the intermediate region located between the peripheral region and the active region. Due to this, thermal expansion of the first metal layer in a direction from the edge portion of the protective insulating film (i.e., triple-contact portion) toward the active region can be suppressed by the at least one second part of the contact plug. Therefore, generation of a crack extending from the edge portion of the protective insulating film (i.e., triple-contact portion) toward the active region can be suppressed. Thus, according to this semiconductor device, a crack reaching the active region is less likely to be generated. Due to this, this semiconductor device is highly reliable.

DETAILED DESCRIPTION

Figure 1:
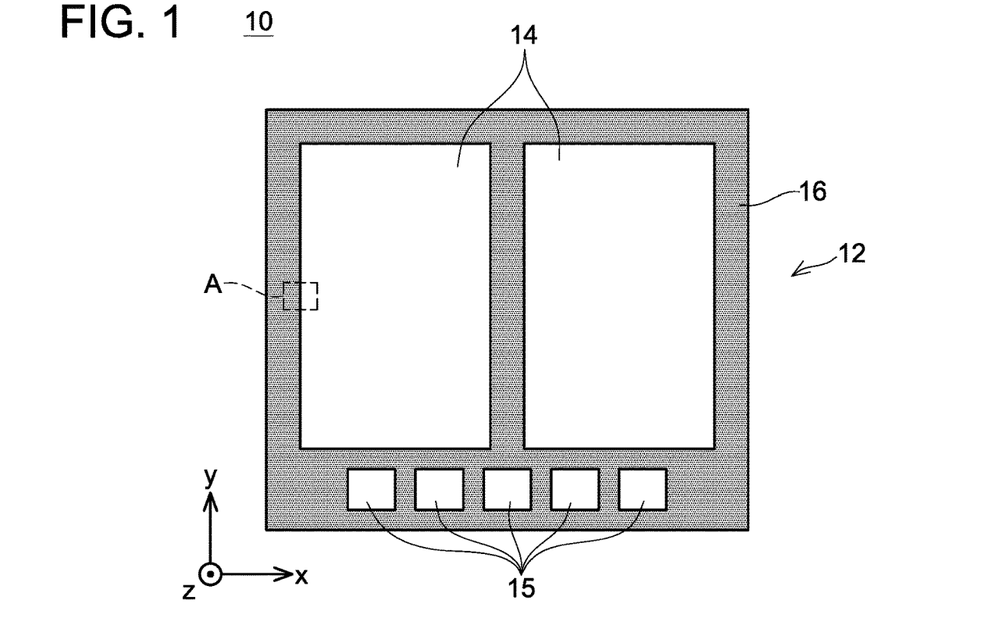
FIG. 1 is a plan view of a semiconductor device 10.
Figure 2:
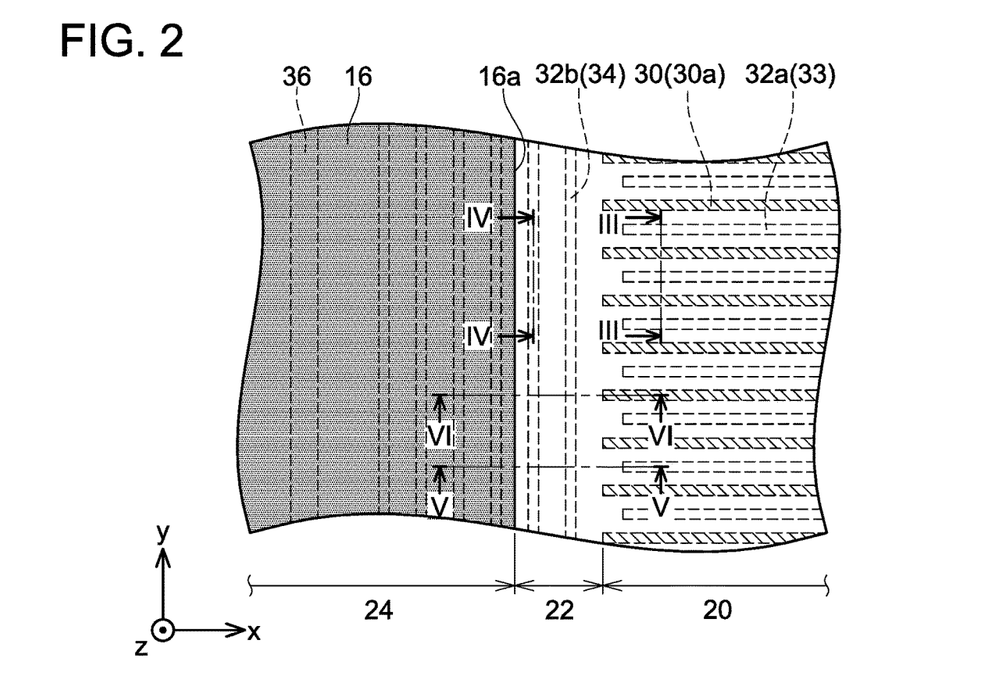
FIG. 2 is an enlarged view of a range A in FIG. 1.

A semiconductor device 10 shown in FIG. 1 comprises a semiconductor substrate 12. The semiconductor substrate 12 is constituted of silicon. Hereinafter, a direction parallel to an upper surface of the semiconductor substrate 12 will be termed an x-direction, a direction parallel to the upper surface of the semiconductor substrate 12 and perpendicular to the x-direction will be termed a y-direction, and a direction along a thickness of the semiconductor substrate 12 will be termed a z-direction. A linear expansion coefficient of the semiconductor substrate 12 is approximately $4 \times 10^{-6}/°$ C. The upper surface of the semiconductor substrate 12 is provided with electrodes, a protective insulating film 16, and the like. In FIGS. 1 and 2, a range of an upper surface of the semiconductor device 10 which is covered by the protective insulating film 16 is hatched in grey. As shown in FIG. 1, two emitter electrodes 14 and a plurality of signal electrodes 15 are exposed at the upper surface of the semiconductor device 10. The protective insulating film 16 is exposed around these electrodes 14, 15.

Figure 3:
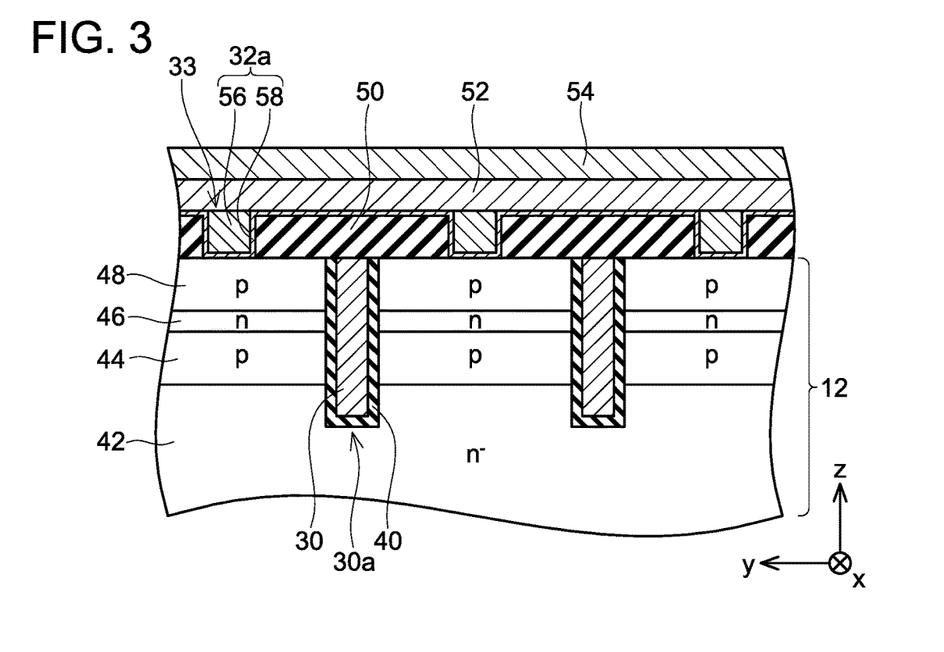
FIG. 3 is a cross sectional view along a line III-III in FIG. 2.
Figure 4:
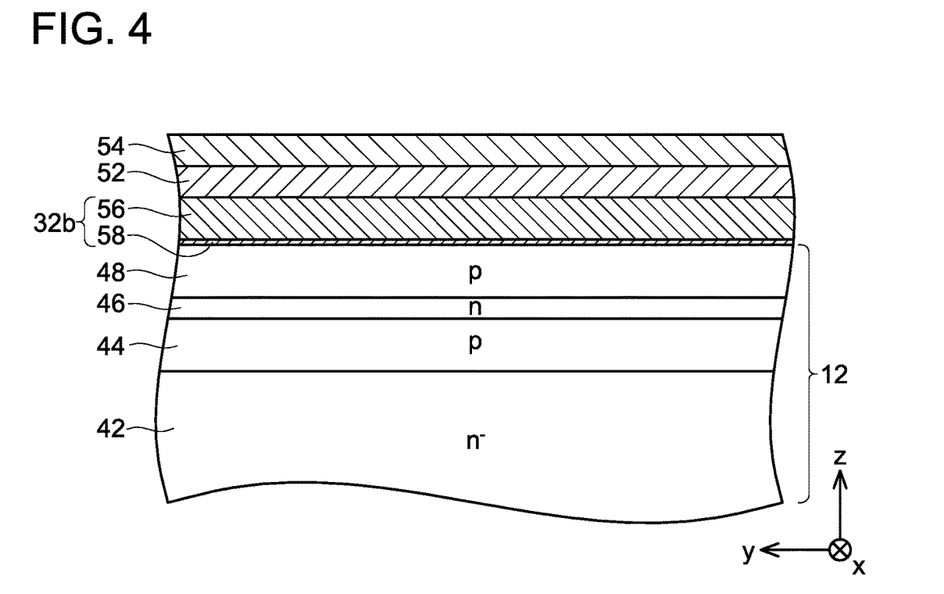
FIG. 4 is a cross sectional view along a line IV-IV in FIG. 2.

FIG. 2 shows an enlarged view of a range A in FIG. 1. FIG. 2 enlarges a border portion between a range where the protective insulating film 16 is provided and one of ranges where the protective insulating film 16 is not provided. Hereinafter, a region in which the protective insulating film 16 is provided (a region around the emitter electrodes 14) when the semiconductor device 10 is seen from above will be termed a peripheral region 24. As shown in FIGS. 2 and 3, a plurality of trenches 30a is provided in the upper surface of the semiconductor substrate 12 in each of the ranges where the protective insulating film 16 is not provided. For the sake of easier view, the trenches 30a are hatched by oblique lines in FIG. 2. As shown in FIG. 2, each of the trenches 30a extends linearly in the x-direction in the upper surface of the semiconductor substrate 12. The trenches 30a are arranged with intervals in the y-direction. As described later in detail, an IGBT (Insulated Gate Bipolar Transistor) is provided in a range where the trenches 30a are distributed. Hereinafter, a region where the trenches 30a are provided (i.e., each region where the IGBT is provided) when the semiconductor device 10 is seen from above will be termed an active region 20. As shown in FIG. 2, an interval is provided between the peripheral region 24 and the active region 20. Hereinafter, a region located between the peripheral region 24 and the active region 20 will be termed an intermediate region 22.

As shown in FIG. 3, an inner surface of each trench 30a is covered by a gate insulating film 40. A gate electrode 30 is provided in each trench 30a. Each gate electrode 30 is insulated from the semiconductor substrate 12 by its corresponding gate insulating film 40.

Figure 5:
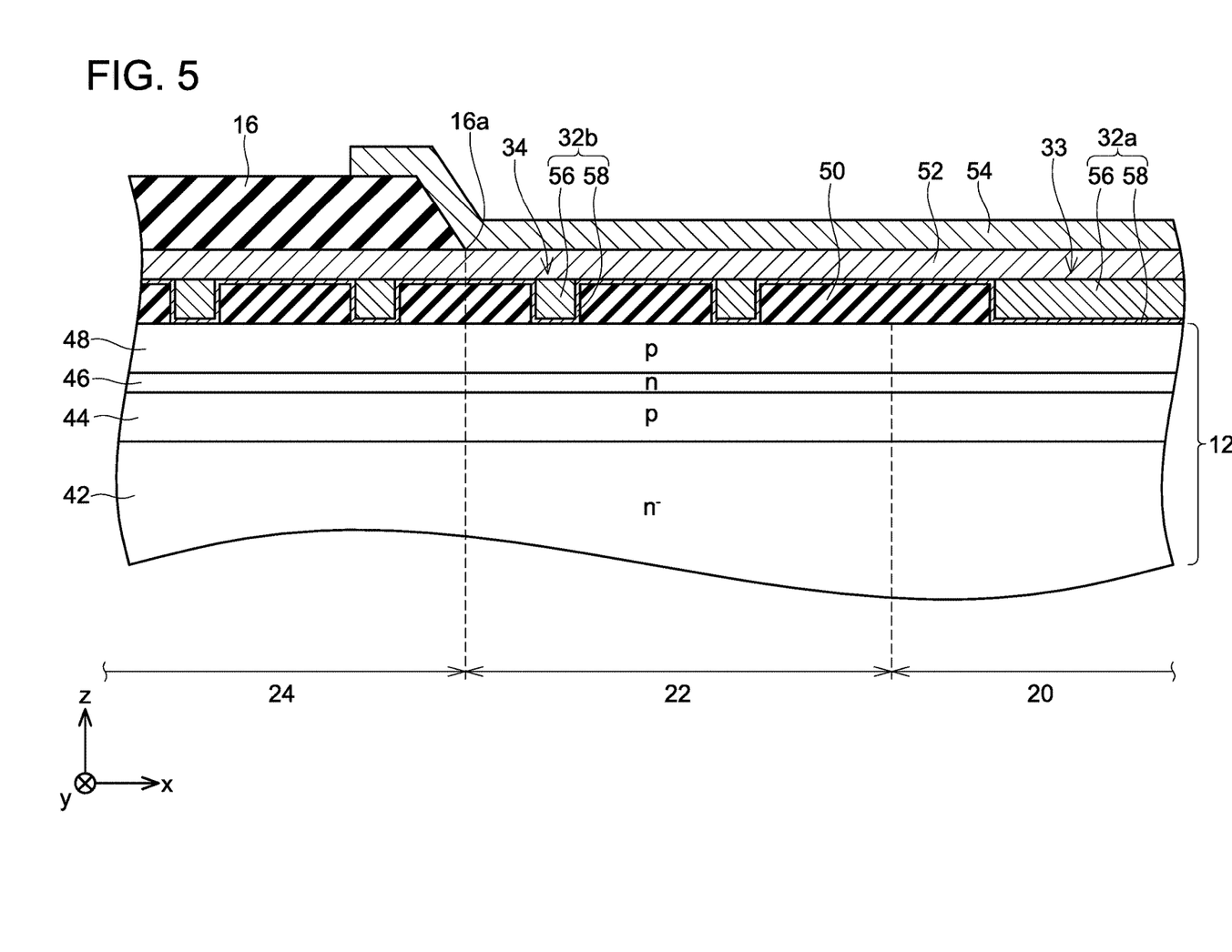
FIG. 5 is a cross sectional view along a line V-V in FIG. 2.
Figure 6:
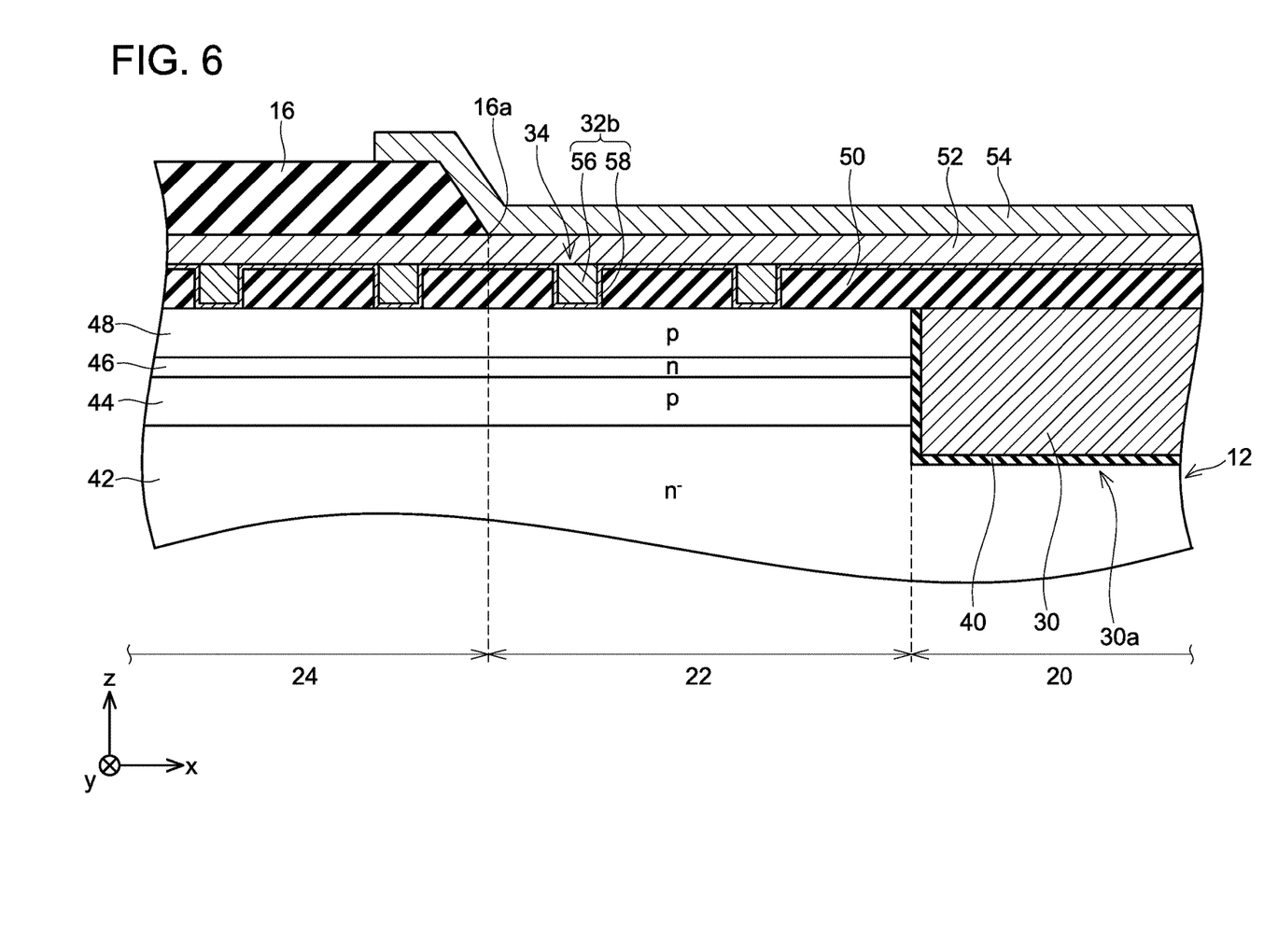
FIG. 6 is a cross sectional view along a line VI-VI in FIG. 2.

As shown in FIGS. 3, 5, and 6, an interlayer insulating film 50 is provided on the upper surface of the semiconductor substrate 12. The interlayer insulating film 50 is constituted of silicon oxide. A linear expansion coefficient of the interlayer insulating film 50 is approximately $0.5 \times 10^{-6}/°$ C. As shown in FIGS. 5 and 6, the interlayer insulating film 50 covers the upper surface of the semiconductor substrate 12 across the active region 20, the intermediate region 22, and the peripheral region 24. A plurality of contact holes 33 and a plurality of contact holes 34 are provided in the interlayer insulating film 50. As shown in FIG. 3, in the active region 20, each of the contact holes 33 is provided at a position between each pair of the trenches 30a. As shown in FIG. 2, when the semiconductor device 10 is seen from above, the contact holes 33 in the active region 20 extend linearly in the x-direction in parallel with the trenches 30a. Further, as shown in FIG. 2, the contact holes 34 extending linearly in the y-direction when the semiconductor device 10 is seen from above are provided in the intermediate region 22 and the peripheral region 24. The plurality of contact holes 34 is provided in each of the intermediate region 22 and the peripheral region 24.

As shown in FIGS. 3 to 6, an inner surface of each of the contact holes 33, 34 and an upper surface of the interlayer insulating film 50 are covered by a barrier metal 58. The barrier metal 58 is a metal layer constituted of TiN and the like. The barrier metal 58 is in contact with the semiconductor substrate 12 within the contact holes 33, 34. Further, a W layer 56 is provided inside each of the contact holes 33, 34. The W layers 56 axe constituted of tungsten, and fill the insides of the contact holes 33, 34 with no space left therein. The W layers 56 cover a surface of the barrier metal 58 in the contact holes 33, 34. The barrier metal 58 prevents metallic atoms from diffusing to the semiconductor substrate 12 from the W layers 56. Hereinafter, the barrier metal 58 and the W layer 56 located inside each of the contact holes 33 will be termed a contact plug 32a, and the barrier metal 58 and the W layer 56 located inside each of the contact holes 34 will be termed a contact plug 32b. The contact plugs 32a, 32b penetrate the interlayer insulating film 50 from its upper surface to a lower surface thereof, and are in contact with the semiconductor substrate 12. As shown in FIG. 2, each of the contact plugs 32a in the active region 20 extends linearly in the x-direction. That is, each of the contact plugs 32a extends along a direction from a center side of the active region 20 toward the peripheral region 24. Each of the contact plugs 32h in the intermediate region 22 and the peripheral region 24 extends linearly in the y-direction. That is, each of the contact plugs 32b extends along an edge portion 16a of the protective insulating film 16 which is located on an intermediate region 22 side.

As shown in FIGS. 3 to 6, upper surfaces of the W layers 56 and an upper surface of the barrier metal 58 outside the contact holes 33, 34 are covered by an AlSi layer 52. The AlSi layer 52 is constituted of alloy of aluminum and silicon. As shown in FIGS. 5 and 6, the AlSi layer 52 extends across the active region 20, the intermediate region 22, and the peripheral region 24. A linear expansion coefficient of the AlSi layer 52 is approximately $19 \times 10^{-6}/°$ C.

As shown in FIGS. 5 and 6, an upper surface of the AlSi layer 52 in the peripheral region 24 is covered by the aforementioned protective insulating film 16. The protective insulating film 16 is constituted of polyimide. A linear expansion coefficient of the protective insulating film 16 is approximately $25 \times 10^{-6}/°$ C., which is higher than the linear expansion coefficient of the AlSi layer 52.

As shown in FIGS. 3 to 6, the upper surface of the AlSi layer 52 in the active region 20 and the intermediate region 22 is covered by a Ni layer 54. The Ni layer 54 is constituted of nickel. As shown in FIGS. 5 and 6, the Ni layer 54 covers an upper surface of the protective insulating film 16 in a vicinity of the edge portion 16a of the protective insulating film 16. A linear expansion coefficient of the Ni layer 54 is approximately $13 \times 10^{-6}/°$ C., which is lower than the linear expansion coefficient of the AlSi layer 52 and the linear expansion coefficient of the protective insulating film 16. The edge portion 16a of the protective insulating film 16 (i.e., the border portion between the peripheral region 24 and the intermediate region 22) is a triple-contact portion where the AlSi layer 52, the protective insulating film 16, and the Ni layer 54 are in contact with each other.

The aforementioned emitter electrodes 14 are constituted of the contact plugs 2a, 32b, the AlSi layer 52, and the Ni layer 54.

As shown in FIG. 2, a gate wiring 36 is provided under the protective insulating film 16. The gate wiring 36 is connected to each of the gate electrodes 30 at positions which are not shown.

As shown in FIGS. 3 to 6, the semiconductor substrate 12 comprises an upper body region 48, a separation region 46, a lower body region 44, and a drift region 42. The upper body region 48 is of p-type, and is in contact with the gate insulating films 40 and the contact plugs 32a, 32b in a vicinity of the upper surface of the semiconductor substrate 12. The separation region 46 is of n-type, and is in contact with the gate insulating films 40 under the upper body region 48. The lower body region 44 is of p-type, and is in contact with the gate insulating films 40 under the separation region 46. The drift region 42 is of n-type, and is in contact with the gate insulating films 40 under the lower body region 44 (at lower ends of the trenches 30a). Further, the semiconductor substrate 12 comprises emitter regions and a collector region, although they are not shown. The emitter regions are of n-type, and are in contact with the gate insulating films 40 and the contact plugs 32a in the vicinity of the upper surface of the semiconductor substrate 12. The emitter regions are separated from the separation region 46 by the upper body region 48. The collector region is of p-type, and is located below the drift region 42. The collector region is in contact with a collector electrode (not shown) provided on a lower surface of the semiconductor substrate 12.

The active region 20 is provided with an IGBT configured to control a current between the emitter electrode 14 and the collector electrode according to a potential of the gate electrodes 30. When the potential of the gate electrodes 30 is increased to or higher than a threshold value, channels are formed in the upper body region 48 and the lower body region 44 in ranges being in contact with the gate insulating films 40. Due to this, a current flows from the collector electrode to the emitter electrode 14. When the potential of the gate electrodes 30 is decreased to become lower than the threshold value, the channels disappear and the current stops.

When the IGBT is turned on and off repeatedly, a temperature of the semiconductor device 10 changes. When the temperature of the semiconductor device 10 changes, thermal stress is generated in the semiconductor device 10. At this occasion, high thermal stress is generated in the edge portion 16a because the protection insulating film 16, the AlSi layer 52, the Ni layer 54, which have the different linear expansion coefficients, are in contact with each other at the edge portion 16a of the protection insulating film 16. Repeated generation of high thermal stress in the edge portion 16a may result in a crack in the AlSi layer 52 with the edge portion 16a as its starting point. If the crack generated in the AlSi layer 52 extends to the active region 20, characteristics of the semiconductor device 10 may be deteriorated. However, in the semiconductor device 10 of the present embodiment, the contact plugs 32b are provided in the intermediate region 22 located between the edge portion 16a of the protective insulating film 16 and the active region 20. As shown in FIGS. 5 and 6, the contact plugs 32b are provided so as to penetrate the interlayer insulating film 50 and reach the semiconductor substrate 12. Since the contact plugs 32b are provided so as to cut into the interlayer insulating film 50 and reach the semiconductor substrate 12 having the low linear expansion coefficient as such, thermal expansion of the AlSi layer 52 is suppressed by an anchor effect. Due to this, thermal stress generated in the AlSi layer 52 is suppressed. In particular, the thermal expansion of the AlSi layer 52 in the x-direction can be suppressed by the contact plugs 32b extending linearly along the y-direction. Due to this, generation of a crack extending along the x-direction can be effectively suppressed. That is, in the present embodiment, generation of a crack extending from the edge portion 16a of the protective insulating film 16 toward the active region 20 can be effectively suppressed by the contact plugs 32b. Therefore, in the semiconductor device 10, a crack is less likely to reach the active region 20, and thus the characteristic deterioration is less likely to occur. Due to this, the semiconductor device 10 is highly reliable.

In a semiconductor device of a comparative example shown in FIG. 9, gate electrodes 130 extend to a portion under a gate wiring 136 in a peripheral region 124, and the gate electrodes 130 are connected to the gate wiring 136 at that portion. Contact plugs 132 in an active region 120 extend to the peripheral region 124 (i.e., extend to a portion under a protective insulating film 116). In the configuration of FIG. 9, an effect that suppresses the thermal expansion of the AlSi layer in the x-direction in an edge portion 116a of the protective insulating film 116 is low. Therefore, high stress is likely to be generated in the edge portion 116a (i.e., triple-contact portion), and a crack extending toward the active region 120 is likely to be generated with the edge portion 116a as its starting point. Contrary to this, by providing the contact plugs 32b extending in the y-direction in the intermediate region 22 as shown in FIG. 2, generation of the crack extending toward the active region 20 can be effectively suppressed. In particular, since the plurality of contact plugs 32b is provided with intervals in the x-direction in the intermediate region 22, the thermal stress generated in the AlSi layer is suppressed more effectively. Therefore, generation of the crack extending toward the active region 20 can be suppressed more effectively.

Further, as shown in FIG. 2, by providing the contact plugs 32b extending in the y-direction in the peripheral region 24 as well, stress applied to the AlSi layer 52 (especially on the AlSi layer 52 at the triple-contact portion) can be reduced, and the crack can be further suppressed.

Figure 7:
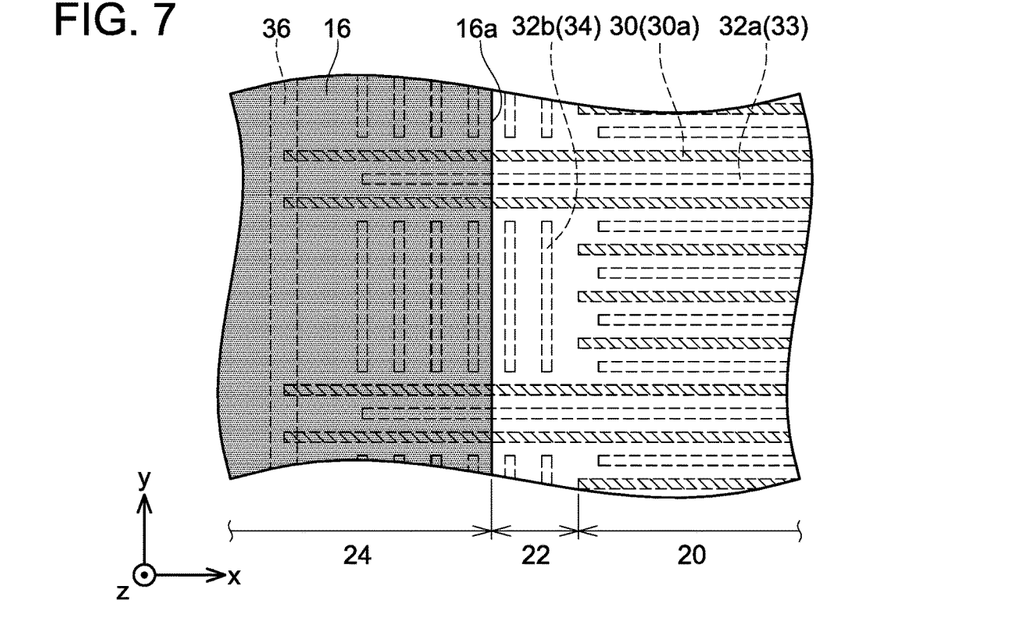
FIG. 7 is an enlarged view for a semiconductor device of a variant, corresponding to FIG. 2.
Figure 8:
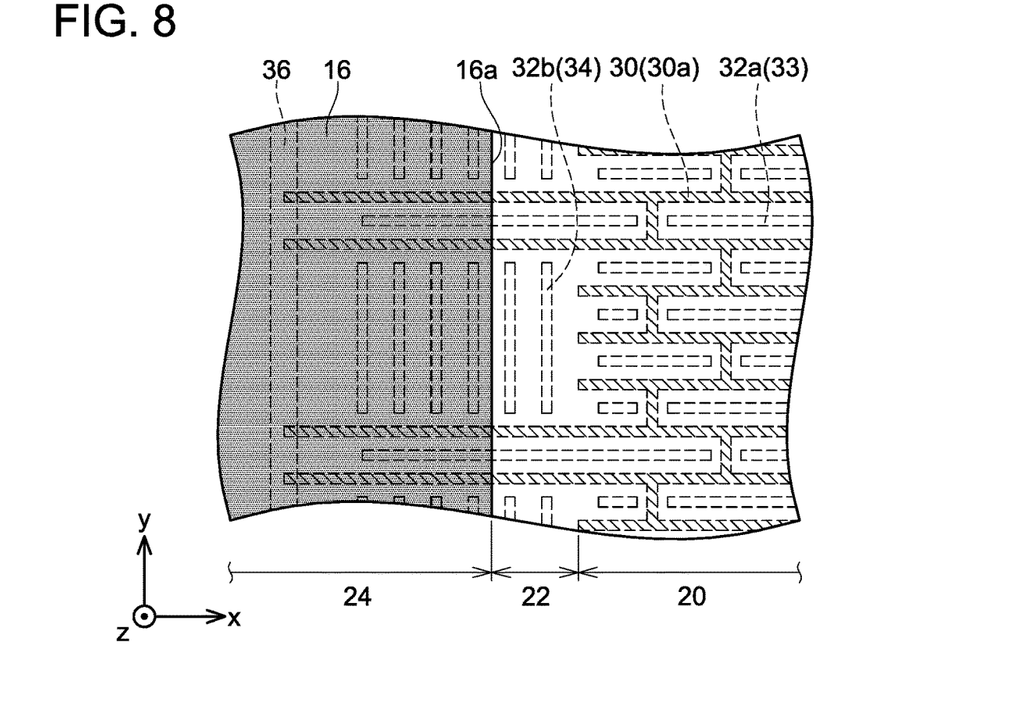
FIG. 8 is an enlarged view for a semiconductor device of another variant, corresponding to FIG. 2.

It should be noted that the contact plugs 32b may be provided so as to be partially discontinuous, as shown in FIG. 7. In FIG. 7, the gate electrodes 30 extend to a portion under the gate wiring 36 in ranges where the contact plugs 32b are discontinuous, and the gate electrodes 30 and the gate wiring 36 are connected to each other at that portion. In such a configuration as well, generation of the crack extending toward the active region 20 can be suppressed by the contact plugs 32b. Further, as shown in FIG. 8, the gate electrodes 30 extending in the x-direction may be connected to each other by gate electrodes 30 extending in the y-direction in the active region 20.

Further, in the aforementioned embodiment, the Ni layer 54 covers the upper surface of the protective insulating film 16 in the vicinity of the edge portion 16a. However, so long as the Ni layer 54 is in contact with the edge portion 16a of the protective insulating film 16, the Ni layer 54 may not cover the upper surface of the protective insulating film 16.

Further, although the IGBT is provided in the active region 20 in the aforementioned embodiment, other element such as a MOSFET, a diode, and the like may be provided in the active region 20.

Relationships between the constituent elements of the embodiment and the constituent elements of the claims will be described below. The AlSi layer of the embodiment is an example of first metal layer of the claims. The Ni layer of the embodiment is an example of second metal layer of the claims. The contact plug 32a of the embodiment is an example of first part of contact plug of the claims. The contact plug 32b of the embodiment is an example of second part of the contact plug in the claims.

Some of the technical elements disclosed herein will be listed, below. It should be noted that the respective technical elements are independent of one another, and are useful solely or in combinations.

In an example of semiconductor device disclosed herein, a plurality of the second parts of the contact plug may be provided in the intermediate region.

According to such a configuration, extension of the crack from the triple-contact portion to the active region can be suppressed more effectively.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed.

Further, the purpose of the examples illustrated by the present description or drawings is to satisfy multiple objectives simultaneously, and satisfying any one of those objectives gives technical utility to the present invention.

What is claimed is:

1. A semiconductor device, comprising:
   a semiconductor substrate;
   an interlayer insulating film located on the semiconductor substrate;
   a contact plug constituted of a metal, penetrating the interlayer insulating film, and being in contact with the semiconductor substrate;
   a first metal layer covering a surface of the interlayer insulating film and a surface of the contact plug;
   a protective insulating film covering a part of a surface of the first metal layer; and
   a second metal layer covering the surface of the first metal layer, being in contact with an edge portion of the protective insulating film, and constituted of a metal different from that of the first metal layer,
   wherein
   the semiconductor device comprises a peripheral region, an active region, and an intermediate region in a view along a thickness direction of the semiconductor device,
     the peripheral region is a region in which the protective insulating film is located;
     the active region is a region in which a plurality of first parts of the contact plug is located; and
     the intermediate region is a region which is located between the peripheral region and the active region and in which at least one second part of the contact plug is located,
   the first parts extend toward the edge portion of the protective insulating film, and
   the at least one second part extends along the edge portion of the protective insulating film.

2. The semiconductor device of claim 1, wherein a plurality of the second parts of the contact plug is located in the intermediate region.

* * * * *